United States Patent
Lakich et al.

(10) Patent No.: US 8,322,215 B2
(45) Date of Patent: Dec. 4, 2012

(54) ACCELEROMETER BASED REMOVAL AND INVERSION TAMPER DETECTION AND TAP SWITCH FEATURE

(75) Inventors: Daniel M. Lakich, Walhalla, SC (US); Jiangyang Huang, Seneca, SC (US)

(73) Assignee: Itron, Inc., Liberty Lake, WA (US)

( * ) Notice: Subject to any disclaimer, the term of this patent is extended or adjusted under 35 U.S.C. 154(b) by 283 days.

(21) Appl. No.: 12/880,339

(22) Filed: Sep. 13, 2010

(65) Prior Publication Data
US 2012/0060606 A1    Mar. 15, 2012

(51) Int. Cl.
*G01P 15/00* (2006.01)
*G08B 23/00* (2006.01)

(52) U.S. Cl. ............... 73/514.16; 73/504.04; 73/514.29; 340/500

(58) Field of Classification Search ............... 73/514.16, 73/504.04, 514.15, 514.29; 340/500
See application file for complete search history.

(56) References Cited

U.S. PATENT DOCUMENTS

| | | | |
|---|---|---|---|
| 2,784,501 A * | 3/1957 | Stern et al. ............. | 434/49 |
| 5,473,322 A | 12/1995 | Carney | |
| 5,910,774 A | 6/1999 | Capriotti et al. | |
| 6,232,886 B1 | 5/2001 | Morand | |
| 6,852,935 B2 | 2/2005 | Higgins et al. | |
| 7,453,373 B2 | 11/2008 | Cumeralto et al. | |
| 7,495,555 B2 | 2/2009 | Seal et al. | |
| 2007/0103334 A1 | 5/2007 | Soni | |
| 2009/0133499 A1 | 5/2009 | Cato | |
| 2010/0256947 A1 * | 10/2010 | Kim et al. ............. | 702/141 |

OTHER PUBLICATIONS

PCT International Search Report for PCT International Application No. PCT/US2011/051181, search completed Dec. 14, 2011, mailed Dec. 23, 2011.
PCT Written Opinion of the International Searching Authority for PCT International Application No. PCT/US2011/051181, opinion completed Dec. 14, 2011, date of mailing Dec. 23, 2011.

* cited by examiner

*Primary Examiner* — J M Saint Surin
(74) *Attorney, Agent, or Firm* — Dority & Manning, P.A.

(57) ABSTRACT

Disclosed are apparatus and methodologies for detecting inversion tamper, removal tamper, and taps using a three-axes accelerometer sensor in a utility meter environment. Inversion tamper is detected upon power up if the acceleration value along Y axis is greater than or equal to some small positive threshold. Removal tamper is detected if the average acceleration change of both Y and Z axes is greater than or equal to the removal threshold. A tap is detected if the average acceleration change along the X axis is greater than or equal to the tap threshold. The initial acceleration values are set upon power up. Removal tamper detection and tap detection are distinguished using a moving average filter. Tap detection uses timing constraints to avoid false tap detections.

15 Claims, 5 Drawing Sheets

ACCELEROMETER BASED REMOVAL AND INVERSION TAMPER DETECTION AND TAP SWITCH FEATURE

FIELD OF THE INVENTION

The present subject matter relates to acceleration detection and measurement in electric meters. More specifically, the present technology relates to the use of an accelerometer to implement meter tamper detection as well as to provide tap responsive functionality to implement meter display control and other functions.

BACKGROUND OF THE INVENTION

Tamper detection in Automatic Meter Reading/Advanced Metering Infrastructure (AMR/AMI) electric meters has previously often consisted of a mechanical sensor that changes state when tilted more than a predetermined number of degrees. Such "tilt" sensors were used in conjunction with power-down and power-up of the electric meter as an indicator whether the product "may" have been tampered with. Two indicators are currently provided in Itron's OpenWay CENTRON AMI meter, namely, removal and inversion.

Likewise, invocation (i.e., selection) of alternate display sequences in electronic meters has previously been achieved through the use of mechanical switches and later by magnetic switches. Both of such devices have a cost associated with them and have functional limitations. Mechanical switches bear additional product cost and use up portions of limited real estate on the face of the product. A magnetic switch approach is quite effective but requires utility field personnel to carry a magnet to the field to invoke the display sequence of interest which also bears additional product cost as well as inconvenience.

It is desirable that meters in the field support reliable detection of inversion and removal tampers. Some previous configurations used an optical roll ball switch to detect tampers. Although such a switch works in most cases, it does possess several limitations. First, it requires that the socket be installed as vertically as possible and cannot tilt more than a predetermined amount. In exemplary installation the meter should not tilt more than twenty degrees. Second, the detection is very sensitive to the angle in which the socket tilts. Third, due to the switch's limited angle range, a removal tamper in which the tilting angle is less than a predetermined amount (for example, twenty degrees in an exemplary configuration) would not be detected.

Known patents related to the present field of inquiry include U.S. Pat. No. 7,495,555 to Seal et al., directed to "Magnetic Field Sensing For Tamper Identification," U.S. Pat. No. 7,453,373 to Cumeralto et al., directed to an "Integrated Meter Module And Utility Metering System," U.S. Pat. No. 6,852,935 to Higgins et al., directed to a "Tilt Switch," and U.S. Pat. No. 5,910,774 to Capriotti et al., directed to a "Sensor For Count And Tamper Detection." Each of such patents is owned by the owner of the present subject matter and is fully incorporated herein for all purposes.

While various implementations of tamper detection systems have been developed, and while various combinations of tap responsive devices have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, improved apparatus and methodologies have been provided to enable improved tap and tamper functionality in an electric meter.

In accordance with certain embodiments for the present subject matter, a method has been provided to enable tamper and tap detection in an electric meter, comprising, providing an electric meter including at least a register, associating a three-axes accelerometer with the register, the accelerometer being capable of providing signals representative of acceleration in X, Y, and Z planes relative to a front view of the electric meter, monitoring for acceleration in the X plane to detect inversion tamper, monitoring for change in acceleration in the Y plane to detect tap, and monitoring for change in acceleration in the X and Z planes to detect removal tamper. In particular embodiments, the method further comprises establishing steady state acceleration values for each of the X, Y, and Z planes, and comparing current X, Y, and Z plane acceleration values to their respective steady state acceleration values.

In more particular embodiments the method establishes steady state acceleration values by sampling and saving a predetermined number of acceleration values for each of the X, Y, and Z planes, discarding the saved values if the predetermined number of acceleration values for each of the individual planes are not within predetermined values of each other and repeating the sampling step, averaging the samples for each of the X, Y, and Z planes individually, and setting the averages for each of the X, Y, and Z planes as the steady state values. In certain embodiments the steady state values are established upon power up of the electric meter and periodically thereafter.

In further embodiments of the present subject matter the method further comprises reading signals from the accelerometer representative of the X and Z planes, determining whether the signals exceed a predetermined threshold, determining whether the electric meter is powered down, and generating a removal tamper alarm.

In further particular embodiments, the method determines the occurrence of a meter tap by providing an electric meter including at least a register, associating an accelerometer with the register, where the accelerometer is capable of providing signals representative of acceleration in the Y plane relative to a front view of the electric meter, reading signals representative of acceleration in the Y plan from the accelerometer, averaging the signals representative of acceleration in the Y plane for a predetermined time period, comparing the average to a predetermined threshold value, identifying occurrence of a potential tap if the average exceeds the predetermined threshold, and identifying occurrence of a tap if the average drops below the predetermined threshold value within a predetermined time.

In certain particular embodiments of the present subject matter, the method further comprises associating a display with the electric meter, starting a first timer upon identification of a first tap, monitoring signals representative of acceleration in the Y plane to determine the occurrence of another tap, and activating a countdown display timer upon timing out of the first timer if a second tap is not detected prior to the first timer timing out. In further particular embodiments the method also comprises starting a second timer concurrently with activation of the countdown display timer, identifying a potential double-tap if a tap is determined to have occurred after the second timer times out and before the countdown display timer times out and identifying occurrence of a double-tap if no further tap is determined to have occurred within a predetermined time period following identification of the potential double-tap. In even more particular embodiments the method further comprises starting a third timer concurrently with identifying occurrence of a double-tap, identifying a potential triple-tap if a tap is determined to have occurred after the third timer times out and before the countdown display timer times out, and identifying occurrence of a triple-tap if no further tap is determined to have occurred within a predetermined time period following identification of the potential triple-tap.

In some embodiments of the present subject matter, the method includes sampling and saving a predetermined number of acceleration values for the Y plane, discarding the saved values if the predetermined number of acceleration values is not within predetermined values of each other and repeating the sampling step, averaging the samples for the Y plane, and setting the average as the predetermined threshold value. In some particular embodiments, the method also includes setting the average as the predetermined threshold value upon power up of the electric meter, and periodically re-sampling, discarding, averaging, and re-setting the predetermined threshold value.

In accordance with other embodiments of the present subject matter, an electric meter is provided comprising a housing, a register, a display, and a three-axes accelerometer, wherein the accelerometer is associated with the register, mounted in the housing, and configured to providing signals representative of acceleration in X, Y, and Z planes relative to a front view of the electric meter, and wherein the register is configured to monitor for acceleration in the X plane to detect inversion tamper, monitor for change in acceleration in the Y plane to detect tap, and monitor for change in acceleration in the X and Z planes to detect removal tamper. In accordance with certain embodiments the register is configured to establish steady state acceleration values for each of the X, Y, and Z planes and to compare current X, Y, and Z plane acceleration values to their respective steady state acceleration values.

In accordance with certain particular embodiments of the present subject matter, the register is configured to activate a display function upon detection of a valid double-tap on the meter housing while in more particular embodiments the register is configured to activate an alternate display function upon detection of a valid triple-tap on the meter housing.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Repeat use of reference characters throughout the present specification and appended drawings is intended to represent same or analogous features or elements of the invention.

DETAILED DESCRIPTION OF THE PREFERRED EMBODIMENTS

As discussed in the Summary of the Invention section, the present subject matter is particularly concerned with the use of accelerometer to provide improved removal and inversion tamper detection as well as to implement tap switch feature functionality in electric meters.

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to the presently preferred embodiments of the subject accelerometer implemented tamper detection and tap switch meter functionalities. Referring now to the drawings, FIG. 1 schematically illustrates an electric meter 100 incorporating aspects of the present technology.

In accordance with present technology, a linear accelerometer sensor may be incorporated in the register of electric meter 100. In an exemplary configuration, this device may correspond to a micro-electronic mechanical sensor (MEMS) capable of detecting motion in three planes. Through the use of such three plane indicators X, Y, Z, the meter firmware is able to detect removal and inversion with equal or better accuracy than the mechanical sensors previously employed for acceleration detection. In addition, new tamper features are possible that will add functional capabilities and value to Meter Data Management (MDM) applications for tamper detection and reporting.

In addition, another important aspect to the present technology is the ability to invoke alternate display sequences without the addition of any mechanical hardware or cost to the product. In accordance with present technology it is possible to detect a reasonably light "tap" on the side 110 along the Y plane of electric meter 100 using a MEMS device and associated firmware algorithms. Through the use of single tap detection as well as multiple taps within a time period, multiple features can be controlled.

Figure 1:
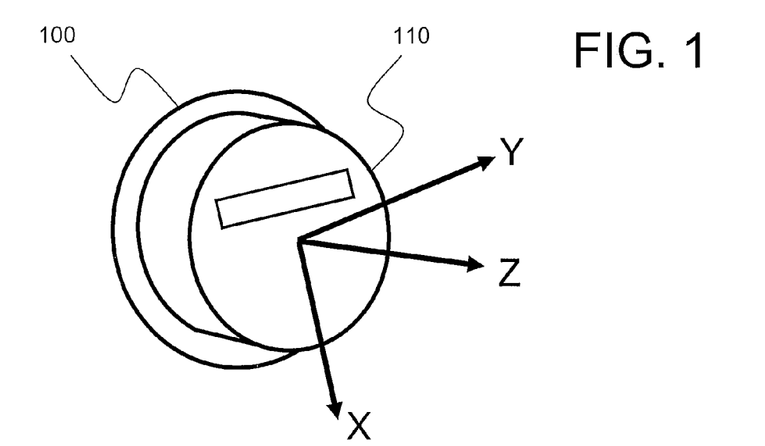
FIG. 1 schematically illustrates an electric meter incorporating aspects of the present technology.

Accelerations along three axes, X, Y and Z shown in FIG. 1, may be measured by a low-cost accelerometer. In an exemplary configuration, the accelerometer may be an LIS331DL, from ST Microelectronics configured to measure accelerations in the X, Y, and Z axes using a data rate of 100 Hz and a steady-state value along each axis between −55 and +55 where the maximum steady-state value of +55 occurs when the axis vertically points up and the minimum steady-state value −55 occurs when the axis vertically points down. In operation, the meter register may be configured to request acceleration data from the accelerometer via the accelerometer's digital interface with a 400 KHz clock rate. Calibration data may be stored inside the accelerometer in a nonvolatile memory so that the accelerometer calibrates itself by restoring the calibration data each time the meter is powered on.

In normal operation, the highest priority task in the electric meter register is configured to wait for signaled semaphores, i.e., control flags, which include an accelerometer semaphore. An interrupt timer may be configured to fire every twenty milliseconds to signal the accelerometer semaphore. When a task detects the signaled accelerometer semaphore, it requests data from the accelerometer and checks the absolute acceleration changes on three axes for the removal tamper and tap detections. In an exemplary configuration, the accelerometer data output may be re-enabled every minute to avoid false data readings. In addition, the accelerometer may be re-calibrated every thirty seconds to ensure that the accelerometer works properly.

In accordance with present technology, inversion tamper detection is simplified through the use of a MEMS accelerometer device. For example, in the X-Axis, if the sign is positive, the unit is inverted so that the combination of a positive reading and power-up can then be interpreted as an inversion tamper. If the meter is inversely installed, the X axis should point down to the earth and the steady-state acceleration value along the X axis should be non-negative. Therefore, inversion tamper detection should be implemented by comparing the acceleration value along the X axis against a configured threshold set to a small positive value.

Figure 2:
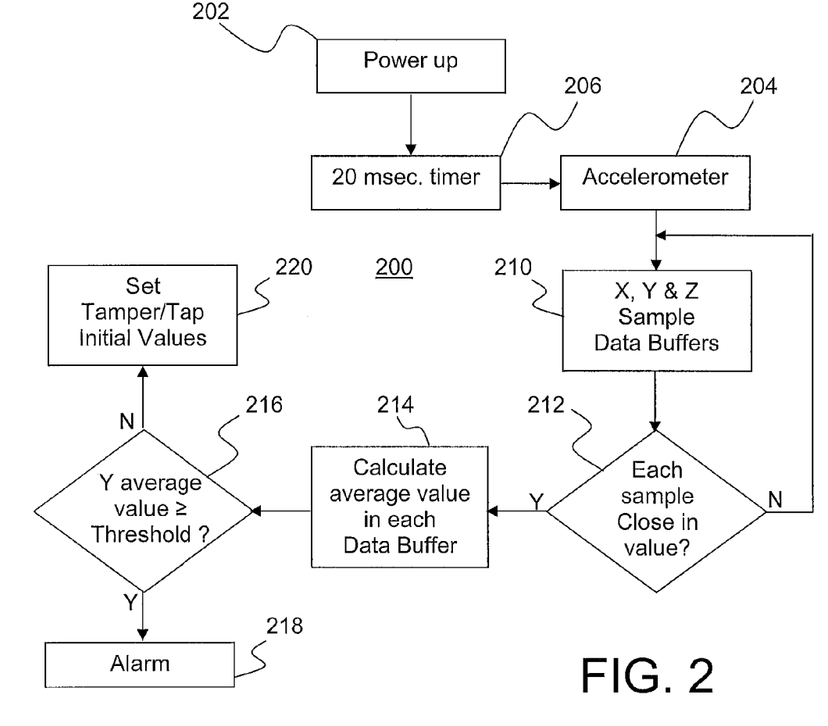
FIG. 2 is a flow chart illustrating steps to insure proper initial value settings for tamper and tap values.

To avoid the possibility that the meter is disturbed upon power up, which could result in incorrect acceleration values for inversion tamper detection, the acceleration values should be sampled with certain requirements as illustrated in flow chart 200 of FIG. 2. For example, when the meter is powered up at step 202, the electric meter register reads the acceleration values from accelerometer 204 along the three axes every twenty milliseconds as determined by timer 206 and puts these values in individual X, Y, Z data buffers 210. When all three acceleration buffers are filled up with, for example, ten samples, the register verifies that each acceleration value in each buffer is close to the values of its neighbors at step 212. If any one of them is not, all buffer data are discarded and a new set of samples for each buffer is read. This process repeats until the data in each buffer are close to one another, i.e., the accelerometer has reached steady state. This method ensures that the accelerometer acquires reliable initial acceleration values that are important to removal tamper and tap detections.

After the data buffers are successfully filled, the average value on each axis is calculated (step 214) and the average value on the X axis is compared to the inversion tamper threshold (step 216). If the average value is greater than or equal to the threshold, an inversion tamper is considered to have been detected and an inversion tamper event may then be recorded and a corresponding alarm 218 sent to, for example, an AMR data Collect Engine, or other appropriate location(s). After that, the average value along each axis is used to set as its initial acceleration value (step 220), which will be used for the detections of removal tamper and tap.

It is an unfortunate fact that sometimes people out of desperation will resort to tampering with wiring in an effort to steal power. In order to tamper with the wiring of an installation, the whole meter cabinet may be manipulated. In doing so, it is inevitable that the meter orientation will change in at least one plane. In such case, the reference reading will change, but an associated power-outage may not be detected. Although not necessarily an alarm condition, such information could be useful to collect over time. In certain instances selected meter types may be given the capability to periodically send reference readings, as well as the most recent maximum deviation from the reference reading, to the data collection system. Such information may be reviewed periodically, for example daily, to determine potential tampering. From day to day, such two readings should remain constant, but, if not, and combined with alarm capabilities of the AMI system, the utility might be able to interdict a tampering individual during the act.

With previously used mechanical sensor systems, meter firmware was typically limited to detection of a state change of the mechanical sensor. Essentially, mechanical sensors correspond to a switch that changes state when tilted beyond a pre-determined angle as dictated by the mechanical design of the sensor. Typically such mechanical sensors were designed to provide such state change if the product was tilted greater than, for example, 20 degrees from vertical. One issue, in practice, is that electric meters are not always mounted exactly vertical. In fact, they can often be mounted very close to or greater than the 20 degree position. This can lead to false tampers that result in wasted time and effort to visit a meter that is simply mounted at an angle. If there are too many false tampers in an AMR/AMI deployment, the feature becomes useless and/or counterproductive due to the overwhelming number of false alarms.

Detection of a removal tamper and of a tap are similar because both are based on acceleration changes. However, it is important that a removal tamper should not be detected when the meter is simply tapped. It is also preferred not to detect a tap during a removal tamper. Therefore, from a design point of view, it is very important to distinguish such two events/functions.

It has been observed that an electric meter has two degrees of freedom when installed in a matching socket; one is a movement along the Z axis and the other is the rotation around the Y axis. When the meter is pulled out of the socket, most frictions between the socket and meter legs are introduced into the X and Z directions. Thus, most acceleration changes along both X and Z axes are typically much larger than most acceleration changes along the Y axis. Based on such observation, the electric meter per present subject matter preferably is configured to monitor acceleration changes along the X and Z axes for the removal tamper detection.

Meanwhile, to distinguish the tapping operation from the removal tamper, the tap operation should be performed along the Y axis such that most acceleration changes along the Y axis is much larger than most acceleration changes along the X and Z axes when the meter is tapped. Therefore, per present subject matter, the meter is preferably configured to check the acceleration change along the Y axis for tap detection.

Figure 3:
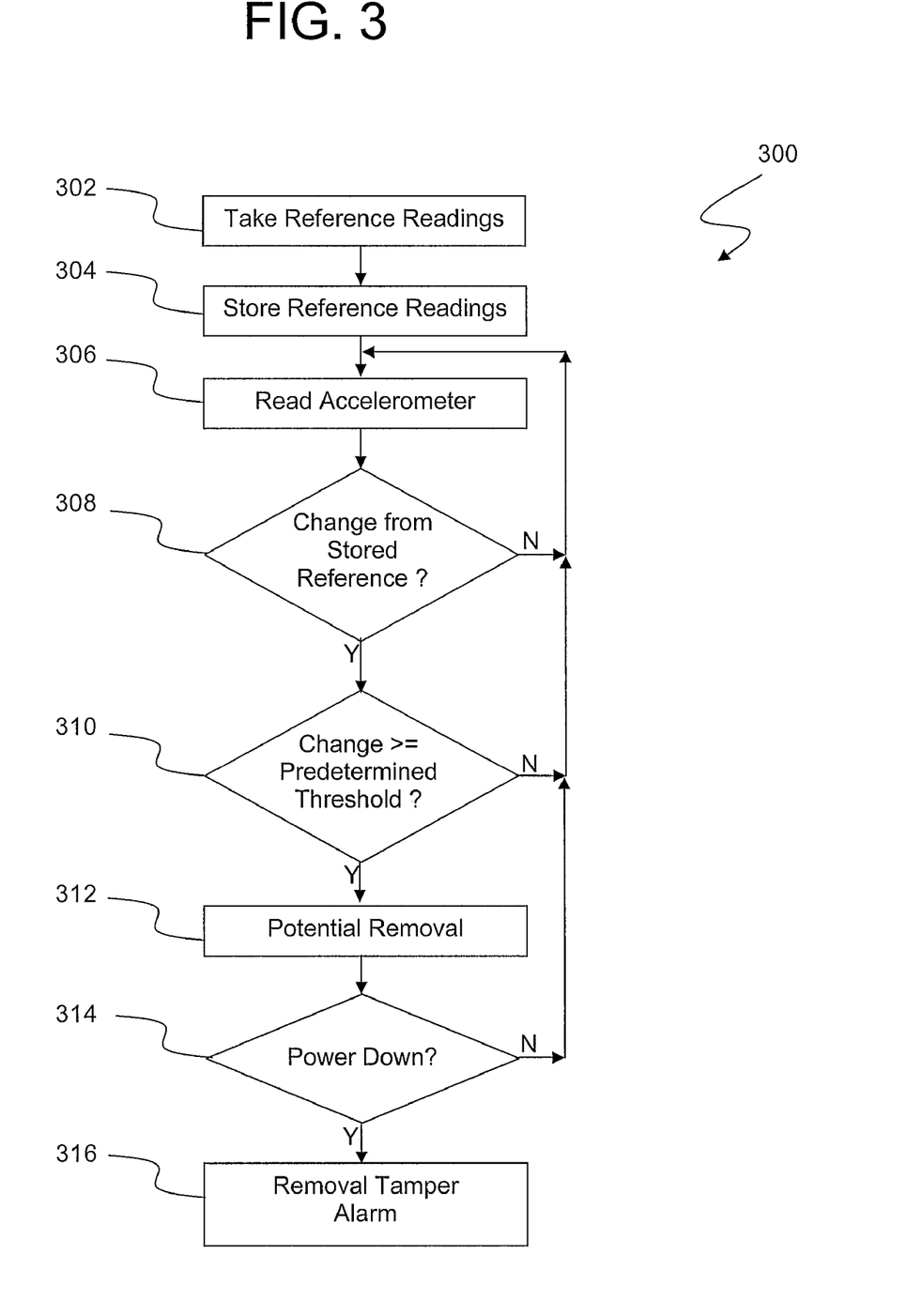
FIG. 3 is a flow chart illustrating steps to detect electric meter tampering in accordance with present technology.

The MEMS accelerometer sensor provides a digital reading of the force being applied in three axes. When at equilibrium, as an electric meter should be in normal use, the digital reading will be unchanging. Tamper detection is achieved in accordance with present technology as illustrated in the exemplary embodiment of present flow chart 300 of FIG. 3. At step 302, the electric meter takes reference readings of all three axes when the product is installed and the readings are unchanging. Such step corresponds generally to step 220 illustrated in FIG. 2. The electric meter stores such readings (step 304) in an on board memory and continues to monitor the sensor (step 306) for a change from the stored references (step 308). Should the "delta" of the reference and the current readings change by greater than or equal to a pre-determined amount (step 310), a potential removal condition 312 is detected. In an exemplary configuration, the assumed amount may correspond to the equivalent of 20° as previously used with mechanical type switches, or some other amount of tilt may be used. When combined with power-down 314, such condition can be interpreted as a removal tamper 316. By using the delta calculation, electric meters incorporating the present technology are advantageously able to achieve a higher tolerance for off-level installations and a more consistent sensitivity to a removal tamper condition.

There may exist sporadically large acceleration changes along the Y axis during tampering. On the other hand, there may exist sporadically large acceleration changes along the X and Z axes during the tapping. Thus, per present subject matter, instantaneous acceleration changes generally are not suitable (or not preferred) for detection purposes. To better distinguish between a removal tamper and a tap, a moving average filter may be used to calculate the average acceleration change that are used for detections. The average acceleration change for the removal detection may be computed according to Equation (1):

$$\overline{\Delta XZ} = \frac{\sum_{n=0}^{N_1-1}(|\Delta X|_{N_1-n} + |\Delta Z|_{N_1-n})}{2N_1} \quad (1)$$

where $\Delta X$ is the acceleration change along the X axis with respect to its initial value, $\Delta Z$ is the acceleration change along the Z axis with respect to its initial value, and $\overline{\Delta XZ}$ is the average value of the most recent $N_1$ number of absolute acceleration changes along X and Z axes. In an exemplary configuration, the sampling number $N_1$ is set to ten because most of the largest acceleration changes along the X and Z axes normally occur within 200 milliseconds during a tampering event.

The average acceleration change for the tap detection is calculated according to Equation (2) as:

$$\overline{\Delta Y} = \frac{\sum_{n=0}^{N_2-1}|\Delta Y|_{N_2-n}}{N_2} \quad (2)$$

where $\Delta Y$ is the acceleration change along the Y axis with respect to its initial value, $\overline{\Delta Y}$ is the average value of the most recent $N_2$ number of absolute acceleration changes along the Y axis. In an exemplary configuration, the sampling number $N_2$ is set to five because most of the largest acceleration changes along the Y axis normally occur within 100 milliseconds of each tap.

A moving average filter makes the detections more tolerant of sporadically large acceleration changes. For example, if there is no vibration during the tampering, the average acceleration change $\overline{\Delta Y}$ during the removal tamper is typically smaller than the average acceleration change $\overline{\Delta XZ}$. If the meter is tapped properly, the average acceleration change $\overline{\Delta XZ}$ is always smaller than the average acceleration change $\overline{\Delta Y}$. Thus, the average acceleration changes are very suitable for the removal tamper and tap detections.

The acceleration values along three axes are polled every twenty milliseconds and the moving average filter calculates the average acceleration change $\overline{\Delta XZ}$ after each poll. If the average value is greater than or equal to the removal tamper threshold, a flag is set to indicate that a potential removal tamper has been detected. Next the meter checks for power down for a period of time. In an exemplary configuration, such may be for ten seconds. If power down does not occur within the predetermined period, the meter disregards such tamper and continues to the next detection. If the power goes away within the predetermined period, the meter reports a removal tamper and increments a removal tamper counter. A removal tamper event is then recorded and a corresponding alarm is sent to the AMR Collect Engine.

Figure 4:
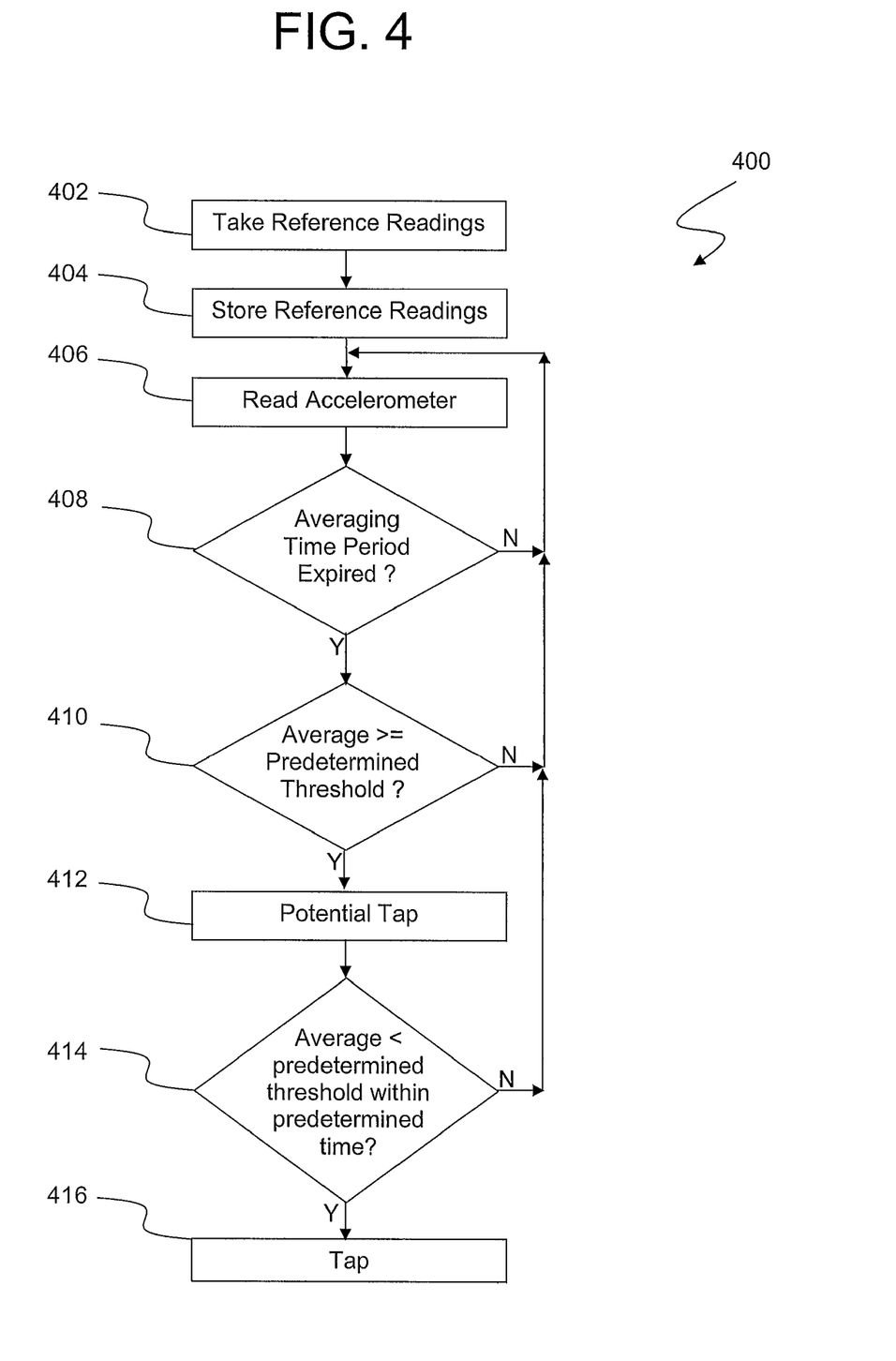
FIG. 4 is a flow chart illustrating steps to detect tapping on an electric meter to implement control features in accordance with present technology.

In accordance with present technology and as illustrated in FIG. 4, tap detection is implemented in accordance with flow chart 400 by monitoring the average acceleration change along the Y axis. In a manner similar to that illustrated and discussed with reference to FIG. 3 herein above, tap reference readings are taken (step 402) and stored (step 404) wherein the tap reference generally corresponds, as did with reference to step 302 of FIG. 3, to the initial values of step 220 in FIG. 2. In an exemplary configuration, the accelerometer is read (step 406) and an average is computed (step 408) at predetermined intervals using a moving average filter. In an exemplary configuration, the predetermined intervals may correspond to every twenty milliseconds. The average value is next compared (step 410) with a predetermined tap threshold, and a potential tap is detected (step 412). If the average acceleration change along the Y axis exceeds the tap threshold and falls below the threshold within a second predetermined time period (step 414), a tap (step 416) is recognized as having occurred. In an exemplary configuration, the second predetermined time period may be 400 milliseconds.

In accordance with present technology, alternate display sequences as well as the more traditional display options and toolbox features can be implemented and controlled by use of tap sequences, for example, "tap-tap" or "tap-tap-tap" on the face of the meter. Such tapping sequences, of course, have the clear advantage over prior implementations in that no additional switches or magnets are required to control such features.

In accordance with present technology, different tap sequences may be employed to activate different function in various electric meter implementations or in the same electric meter. For example, certain electric meters may support both double-tap and triple-tap implementations wherein the double-tap may be used to invoke an alternate display sequence while the triple-tap may be used to invoke a diagnostic display sequence for advanced polyphase meters. To avoid false tap detections due to noises or incorrect tappings, timing constraints may be introduced into the detections of double and triple-taps. For example, a double-tap may be detected only if the second tap does not occur within two seconds but occurs within eight seconds after the first tap. Similarly, a triple-tap may be detected only if the third tap does not occur within two seconds but eight seconds after the second tap.

It should be evident that different users may tap an electric meter implementing the present technology with different subtleties. For example, if someone taps the meter too gently, the tap may not be detected. On the other hand, if someone taps the meter too harshly, a removal tamper may be detected. With this in mind, and as illustrated in FIG. 5, an interactive method has been implemented to provide the user with a friendly set of instructions so that they can better understand and control the tapping process.

Figure 5:
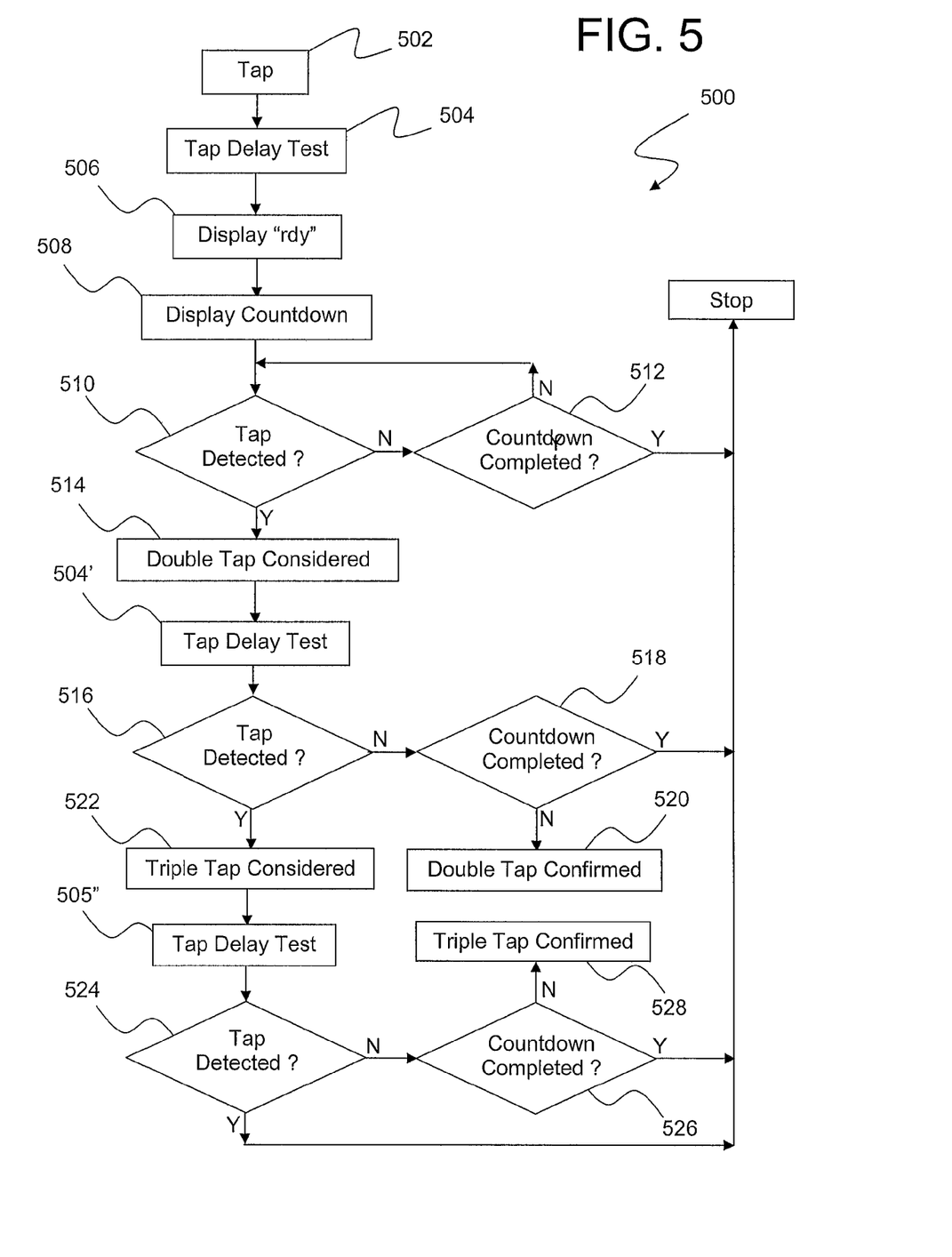
FIG. 5 is a flow chart illustrating an interactive method to provide a user with a set of instructions to better effect tapping control of an electric meter.

As illustrated in FIG. 5, after the electric meter detects a single tap (step 502) using the method illustrated in FIG. 4, the user is instructed to wait (step 504) until the electric meter display shows a "rdy" message (step 506), which means that the meter is ready for the user to apply a second tap. In an exemplary configuration the initial waiting period may be set to about two seconds which is enforced by way of a tap delay test as illustrated in FIG. 6.

Figure 6:
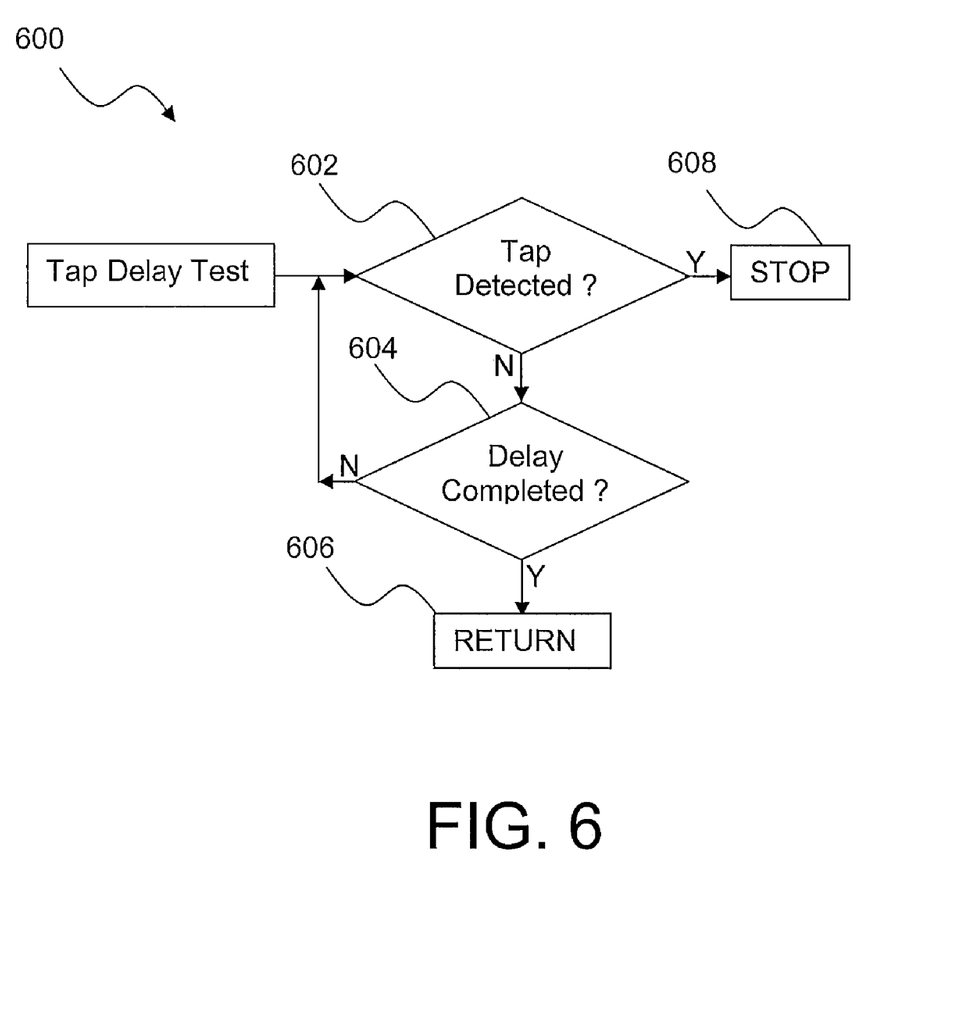
FIG. 6 is a flow chart of a tap delay testing routine used in conjunction with the flow chart of FIG. 5.

With brief reference to FIG. 6, it will be seen that a flow chart has been illustrated of a tap delay test 600. The same test may be called within the flow chart illustrated in FIG. 5 a number of times or may be separately provided for within the operating software or firmware as a particular implementation may employ. In general, however, tap delay test 600 is conducted when in step 602 monitoring is conducted to determine whether a tap has occurred. If no tap is detected a determination is made in step 604 as to whether a time period has expired. In an exemplary configuration, such time period may be set to two seconds. If a tap is detected in step 602, processing stops (step 608) and the meter cancels both taps and performs nothing since such would indicate that a tap occurred within the time, possibly two seconds, when the user was supposed to be waiting but did not. Such feature helps to prevent unauthorized individuals from gaining access to the meter display or controls if they are not familiar with the operational requirements including an initial delay before a second tap is permitted while no other indication or response is provided by the meter.

After the time delay has completed, and assuming no further tap is detected, the routine returns (step 606) to the next step in the flow chart of FIG. 5. In such instance, the electric meter display shows a "rdy" message (step 506), which means that the meter is ready for the user to apply a second tap (step 510). A timer (step 512) associated with the display may then be configured to display a count down (step 508) to inform the user how much time is left before the next tap must be entered to have the meter recognize a potential double tap (step 514). In an exemplary configuration, such may correspond to a countdown from six to zero to indicate that the user is required to tap the meter again within six seconds to have a double tap detected by the meter.

On certain electric meters, a double-tap may be used to invoke an alternate display sequence. The alternate display sequence can be programmed with any display quantities the utility desires for diagnostic purposes. For example, for troubleshooting purposes, the alternate display sequence can be much longer and have many more informational displays than the normal display sequence.

As described above, if the user taps the meter within a predetermined time (for example, six seconds) after a first predetermined waiting period (, for example, two seconds), a double tap is considered to have occurred. Per present subject matter, the meter preferably may then re-enter the tap delay test (step 504'). If the user taps (step 516) the meter during another predetermined time period (for example, two seconds after the second tap), the meter cancels all previous taps and performs nothing. If the user does not tap the meter during the "rdy" display period (step 518), a double-tap 520 is confirmed, and the meter starts showing an alternate display sequence.

If the user taps the meter again during the "rdy" period, a third tap 522 is considered to have occurred. If no further valid tap (steps 504" and 524) is detected during the "rdy" period (step 526), a triple-tap 528 is confirmed to have occurred and for certain meters (for example, an advanced polyphase meter), the meter invokes a diagnostic display sequence. Otherwise, if another tap is detected after the third tap, the meter is configured to cancel all taps and performs nothing.

Although toolbox and site-scan diagnostic quantities can be programmed into the alternate display sequence, it is desirable to have a dedicated set of displays for the user of such quantities. A triple-tap may be used to invoke the diagnostic display sequence in advanced polyphase installations. When the triple-tap is detected, the same diagnostic display sequence that has been previously available in prior electric meters may be displayed.

It is possible to disable all tap features through the meter configuration so that diagnostic displays and possible alternate display sequences can be turned on/off through configuration settings. In exemplary configurations, default settings may be diagnostics-enabled and manual display timeout set to 60 seconds.

For all display modes, the meter may be configured such that a subsequent single-tap on the front of the meter will put the display in a manual scroll mode where it will remain until the end of the display sequence or a timeout, whichever comes first. The length of time for timeout may be programmable in seconds (for example, ranging from 1 to 65535), with a setting of zero configured to disable the manual scroll feature and the timeout.

In accordance with present technology, the sensitivity of the tap detection can be controlled through firmware. It is desirable to set the sensitivity such that false taps are not detected and also such that unnecessary force is not needed to invoke the desired feature. The sensitivity of the tap feature may be programmable to allow for adjustments while installed.

The monitoring of tamper and tap activities requires the register to poll the accelerometer in real time. However, for the majority of its operational time, the meter does not experience any tamper or tap. Thus, it is unnecessary to request the data from the accelerometer when no tamper or tap is ongoing. To reduce the system overhead and power consumption, an interrupt wakeup mechanism is provided. The accelerometer is configured to generate a wakeup interrupt once the acceleration magnitude along the X axis exceeds a wakeup threshold. Because the acceleration along the X axis changes during both removal and tap, the wakeup threshold preferably should be set to some value slightly above the magnitude of the initial acceleration along the X axis.

The register normally does not request the data from the accelerometer and the I2C communication is idle. When the meter is tampered or tapped, a wakeup interrupt from the accelerometer informs the register of potential tamper or tap activities. The register then sets the wakeup flag. An interrupt service routine checks this flag periodically. In an exemplary configuration this may be every twenty milliseconds. When it detects that the flag has been set, it allows the register to start periodically polling the data from the accelerometer and checks the acceleration changes along three axes for the detection of removal tamper or tap.

Meanwhile, the wakeup interrupt is disabled during the polling period. The polling period may be configured to last for some short time period, for example, ten minutes. When the data polling times out, the register stops the data request and re-enables the wakeup interrupt for future detections. However, if the register is either checking for power down or during the tapping process when the polling times out, the register does not stop the data polling until both the power down check and the tapping operation are complete. After the polling, the register samples steady state data every 20 milliseconds for another ten times to refill all buffers. If the meter is not in steady state during this sampling time, the wakeup interrupt will be triggered again. When the register completes the sampling of steady state buffer data, it stops the polling and I2C communication goes idle until the next wakeup occurs.

The meter's angles of installation allow the utility to not only keep track of the socket condition, but also determine potential tampering by reviewing daily angle data. With the use of accelerometer in selected meters, it is feasible to obtain angles of installation. The angles of installation of X, Y and Z axes with respect to the earth ground are calculated by equations (3), (4) and (5), respectively:

$$\varphi = \tan^{-1} \frac{Acc_x}{\sqrt[2]{Acc_y^2 + Acc_z^2}} \quad (3)$$

$$\rho = \tan^{-1} \frac{Acc_y}{\sqrt[2]{Acc_x^2 + Acc_z^2}} \quad (4)$$

$$\theta = \tan^{-1} \frac{Acc_z}{\sqrt[2]{Acc_x^2 + Acc_y^2}} \quad (5)$$

$\varphi$, $\rho$ and $\theta$ are the tilt angles of X, Y and Z axes, respectively; $Acc_x$, $Acc_y$, and $Acc_z$ are acceleration values along X, Y and Z axes, respectively.

The utility can request two angle data from the meter from day to day: reference angles and current angles. The reference angles of installation are immediately calculated upon power up after the inversion tamper detection is complete. Current angles of installation are computed upon request and the meter must be in steady state when current angles are requested. Otherwise, no data should be returned. Once the utility acquires these daily data, potential tampering can be determined if the angle difference on any axis is not reasonably constant.

While the present subject matter has been described in detail with respect to specific embodiments thereof, it will be appreciated that those skilled in the art, upon attaining an understanding of the foregoing may readily produce alterations to, variations of and equivalents to such embodiments. Accordingly, the scope of the present disclosure and claims is by way of example rather than by way of limitation, and the subject disclosure does not preclude inclusion of such modifications, variations and/or additions to the present subject matter as would be readily apparent to one of ordinary skill in the art.

What is claimed is:

1. A method for providing tamper and tap detection in an electric meter, comprising:
    providing an electric meter including at least a register;
    associating a three-axes accelerometer with the register, the accelerometer being capable of providing signals representative of acceleration in X, Y, and Z planes relative to a front view of the electric meter;
    monitoring for acceleration in the X plane to detect inversion tamper;
    monitoring for change in acceleration in the Y plane to detect tap; and
    monitoring for change in acceleration in the X and Z planes to detect removal tamper.

2. The method of claim 1, further comprising;
    establishing steady state acceleration values for each of the X, Y, and Z planes; and
    comparing current X, Y, and Z plane acceleration values to their respective steady state acceleration values.

3. The method of claim 2, wherein the step of establishing comprises:
    sampling and saving a predetermined number of acceleration values for each of the X, Y, and Z planes;
    discarding the saved values if the predetermined number of acceleration values for each of the individual planes are not within predetermined values of each other, and repeating the sampling step;
    averaging the samples for each of the X, Y, and Z planes individually; and
    setting the averages for each of the X, Y, and Z planes as the steady state values.

4. The method of claim 2, further comprising establishing steady state values upon power up of the electric meter and periodically thereafter.

5. The method of claim 1, further comprising:
    reading signals from the accelerometer representative of the X and Z planes;
    determining whether the signals exceed a predetermined threshold;
    determining whether the electric meter is powered down; and
    generating a removal tamper alarm.

6. A method for determining the occurrence of a meter tap, comprising:
    providing an electric meter including at least a register;
    associating an accelerometer with the register, where the accelerometer is capable of providing signals representative of acceleration in the Y plane relative to a front view of the electric meter;
    reading signals representative of acceleration in the Y plane from the accelerometer;
    averaging the signals representative of acceleration in the Y plane for a predetermined time period;
    comparing the average to a predetermined threshold value;
    identifying occurrence of a potential tap if the average exceeds the predetermined threshold; and
    identifying occurrence of a tap if the average drops below the predetermined threshold value within a predetermined time.

7. The method of claim 6, further comprising:
    associating a display with the electric meter;
    starting a first timer upon identification of a first tap;
    monitoring signals representative of acceleration in the Y plane to determine the occurrence of another tap; and
    activating a countdown display timer upon timing out of the first timer if a second tap is not detected prior to the first timer timing out.

8. The method of claim 7, further comprising:
    starting a second timer concurrently with activation of the countdown display timer;
    identifying a potential double-tap if a tap is determined to have occurred after the second timer times out and before the countdown display timer times out; and
    identifying occurrence of a double-tap if no further tap is determined to have occurred within a predetermined time period following identification of the potential double-tap.

9. The method of claim 8, further comprising:
starting a third timer concurrently with identifying occurrence of a double-tap;
identifying a potential triple-tap if a tap is determined to have occurred after the third timer times out and before the countdown display timer times out; and
identifying occurrence of a triple-tap if no further tap is determined to have occurred within a predetermined time period following identification of the potential triple-tap.

10. The method of claim 6, further comprising:
sampling and saving a predetermined number of acceleration values for the Y plane;
discarding the saved values if the predetermined number of acceleration values is not within predetermined values of each other and repeating the sampling step;
averaging the samples for the Y plane; and
setting the average as the predetermined threshold value.

11. The method of claim 10, further comprising:
setting the average as the predetermined threshold value upon power up of the electric meter; and
periodically re-sampling, discarding, averaging, and re-setting the predetermined threshold value.

12. An electric meter, comprising:
a housing;
a register;
a display; and
a three-axes accelerometer,
wherein the accelerometer is associated with the register, mounted in the housing, and configured to providing signals representative of acceleration in X, Y, and Z planes relative to a front view of the electric meter; and
wherein the register is configured to monitor for change in acceleration in the X plane to detect inversion tamper, monitor for change in acceleration in the Y plane to detect tap, and monitor for change in acceleration in the X and Z planes to detect removal tamper.

13. The electric meter of claim 12, wherein the register is configured to establish steady state acceleration values for each of the X, Y, and Z planes and to compare current X, Y, and Z plane acceleration values to their respective steady state acceleration values.

14. The electric meter of claim 12, wherein the register is configured to activate a display function upon detection of a valid double-tap on the meter housing.

15. The electric meter of claim 14, wherein the register is configured to activate an alternate display function upon detection of a valid triple-tap on the meter housing.

* * * * *